(12) United States Patent
Li et al.

(10) Patent No.: US 10,229,003 B2
(45) Date of Patent: Mar. 12, 2019

(54) METHOD AND SYSTEM FOR ITERATIVE DATA RECOVERY AND ERROR CORRECTION IN A DISTRIBUTED SYSTEM

(71) Applicant: Alibaba Group Holding Limited, George Town, Grand Cayman (KY)

(72) Inventors: Shu Li, Bothell, WA (US); Jianjian Huo, San Jose, CA (US)

(73) Assignee: Alibaba Group Holding Limited, George Town (KY)

( * ) Notice: Subject to any disclaimer, the term of this patent is extended or adjusted under 35 U.S.C. 154(b) by 0 days.

(21) Appl. No.: 15/625,529

(22) Filed: Jun. 16, 2017

(65) Prior Publication Data

US 2018/0365102 A1 Dec. 20, 2018

(51) Int. Cl.
  *H03M 13/00* (2006.01)
  *G06F 11/10* (2006.01)
  *H03M 13/29* (2006.01)
  *H03M 13/15* (2006.01)

(52) U.S. Cl.
  CPC ....... *G06F 11/1076* (2013.01); *H03M 13/154* (2013.01); *H03M 13/2906* (2013.01)

(58) Field of Classification Search
  CPC ........... G06F 11/1076; H03M 13/2906; H03M 13/154
  See application file for complete search history.

(56) References Cited

U.S. PATENT DOCUMENTS

| 6,226,650 B1 | 5/2001 | Mahajan et al. |
| 8,260,924 B2 | 9/2012 | Koretz |
| 8,452,819 B1 | 5/2013 | Sorenson, III |
| 8,516,284 B2 | 8/2013 | Chan |
| 9,092,223 B1 | 7/2015 | Pani |
| 2002/0010783 A1 | 1/2002 | Primak |
| 2002/0161890 A1 | 10/2002 | Chen |
| 2004/0255171 A1 | 12/2004 | Zimmer |
| 2004/0268278 A1 | 12/2004 | Hoberman |
| 2005/0177755 A1 | 8/2005 | Fung |
| 2006/0156012 A1 | 7/2006 | Beeson |
| 2009/0282275 A1 | 11/2009 | Yermalayeu |

(Continued)

FOREIGN PATENT DOCUMENTS

| JP | 2003022209 | 1/2003 |
| JP | 2011175422 | 9/2011 |
| WO | 1994018634 | 8/1994 |

*Primary Examiner* — Samir W Rizk

(74) *Attorney, Agent, or Firm* — Shun Yao; Park, Vaughan, Fleming & Dowler LLP

(57) ABSTRACT

One embodiment facilitates iterative data recovery and error correction in a distributed system. During operation, the system receives, by a controller of a first storage device, data to be encoded and stored. The system encodes, by the controller, the data based on an erasure code (EC) to obtain an EC-encoded codeword. The system splits, by the controller, the EC-encoded codeword into sub-blocks. The system encodes, by the controller, a sub-block based on an error correction code (ECC) to obtain an ECC-encoded local sub-block. The system stores the ECC-encoded local sub-block in the first storage device. The system transmits, to a second storage device, a remaining sub-block, wherein the transmitted sub-block is to be ECC-encoded and stored by the second storage device, thereby allowing the data to be subsequently decoded by the first storage device.

21 Claims, 12 Drawing Sheets

(56) References Cited

U.S. PATENT DOCUMENTS

| | | |
|---|---|---|
| 2010/0229224 A1 | 9/2010 | Etchegoyen |
| 2012/0117399 A1 | 5/2012 | Chan |
| 2013/0159251 A1 | 6/2013 | Skrenta |
| 2014/0365707 A1 | 12/2014 | Talagala |
| 2015/0142752 A1* | 5/2015 | Chennamsetty .. G06F 17/30073 707/665 |
| 2015/0372597 A1 | 12/2015 | Luo |
| 2016/0110254 A1* | 4/2016 | Cronie ................ G06F 11/1076 714/766 |
| 2016/0232103 A1 | 8/2016 | Schmisseur |
| 2016/0239074 A1 | 8/2016 | Lee |
| 2016/0350002 A1 | 12/2016 | Vergis |

* cited by examiner

METHOD AND SYSTEM FOR ITERATIVE DATA RECOVERY AND ERROR CORRECTION IN A DISTRIBUTED SYSTEM

BACKGROUND

Field

This disclosure is generally related to the field of data storage. More specifically, this disclosure is related to a system and method for iterative data recovery and error correction in a distributed system.

Related Art

The proliferation of the Internet and e-commerce continues to create a vast amount of digital content. Distributed storage systems have been created to access and store such digital content. In order to ensure the security of sensitive digital content, certain types of encoding may be performed on data to be stored. For example, error correction code (ECC) encoding allows data that is being read or transmitted to be checked for errors and corrected as necessary. In ECC encoding, a first entity may write or store data by creating a codeword (such as a hash value) which describes the data, and store the data along with the codeword. A second entity may read the data by retrieving the data and the codeword, performing the same algorithm on the data to obtain a confirmation codeword, and verifying that the confirmation codeword matches the retrieved codeword. Another example of encoding is erasure code (EC) encoding, which protects data by splitting the data into fragments, expanding the fragments by encoding them with redundant data, and storing the expanded encoded fragments across multiple locations.

A controller in a drive (e.g., a solid state drive or SSD) typically performs ECC encoding, without any access to EC encoding. When performing ECC decoding, the SSD controller may require the error correction rate to meet a low threshold (e.g., below $10^{-17}$). This strict requirement may lead to a long latency for ECC decoding, a need for more complex hardware and firmware, and higher power consumption. For example, the SSD controller may employ hundreds of retry methods to determine the correct codeword (e.g., to perform ECC decoding), which can consume considerable hardware and firmware resources. SSD controllers can work as independent systems without much interaction with the remainder of the distributed system.

At the same time, a central processing unit (CPU) typically performs EC encoding, which can be computationally expensive and thus result in a higher latency. However, EC decoding is typically only used for data recovery, i.e., when the original data cannot be recovered via the powerful ECC decoding. The computationally complex nature of ECC decoding (along with a low error correction rate requirement) may result in a long latency for a single drive's controller to determine an ECC decoding failure. The CPU cannot employ its EC decoder until after it receives a notification of the ECC decoding failure from the single drive (e.g., a failure to find the correct codeword). This latency may decrease the efficiency of a distributed storage system.

SUMMARY

One embodiment facilitates iterative data recovery and error correction in a distributed system. During operation, the system receives, by a controller of a first storage device, data to be encoded and stored. The system encodes, by the controller, the data based on an erasure code (EC) to obtain an EC-encoded codeword. The system splits, by the controller, the EC-encoded codeword into sub-blocks. The system encodes, by the controller, a sub-block based on an error correction code (ECC) to obtain an ECC-encoded local sub-block. The system stores the ECC-encoded local sub-block in the first storage device. The system transmits, to a second storage device, a remaining sub-block, wherein the transmitted sub-block is to be ECC-encoded and stored by the second storage device, thereby allowing the data to be subsequently decoded by the first storage device.

In some embodiments, subsequent to receiving the data, the method is performed in response to determining that the data is received from a client-serving machine. Furthermore, in response to determining that the data is received from a machine that is not a client-serving machine, the system: encodes, by the controller, the received data based on the error correction code; and stores the ECC-encoded data in the first storage device.

In some embodiments, prior to encoding the data based on the erasure code, the system processes the data by: encoding the data based on a cyclic redundancy check; compressing the encoded data; and encrypting the compressed data.

In some embodiments, storing the ECC-encoded local sub-block in the first storage device further comprises: adjusting, by a scrambler module of the controller, a format of the ECC-encoded local sub-block; and writing the adjusted local sub-block to the first storage device.

In some embodiments, writing the adjusted local sub-block to the first storage device further comprises: transmitting the adjusted local sub-block to one or more NAND channels; and writing the adjusted local sub-block into one or more NAND flash pages.

In some embodiments, in advance of encoding the sub-block based on the error correction code, the system identifies the sub-block for processing and storing by the first storage device.

In some embodiments, the EC-encoding is performed by an EC encoder module of the controller, splitting the EC-encoded codeword is performed by a splitter module of the controller, and the ECC-encoding is performed by an ECC encoder module of the controller.

Another embodiment facilitates iterative data recovery and error correction in a distributed system. During operation, the system receives, by a controller of a first storage device, a request to read data stored as encoded sub-blocks on the first storage device and at least a second storage device. The system decodes, by the controller, an encoded local sub-block stored in the first storage device based on an error correction code (ECC). The system merges, by the controller, the ECC-decoded local sub-block and a remaining sub-block obtained from the second storage device, wherein the obtained sub-block has been ECC-decoded by the second storage device. In response to unsuccessfully decoding the merged ECC-decoded sub-blocks based on an erasure code (EC) to obtain EC-decoding results, the system: identifies sub-blocks of the EC-decoding results that require an updated ECC-decoding; re-merges the updated ECC-decoded sub-blocks into the EC-decoding results; and decodes the re-merged ECC-decoded sub-blocks based on the erasure code, thereby allowing the first storage device to decode the data without involving a central processing unit (CPU).

In some embodiments, in response to unsuccessfully decoding the merged ECC-decoded sub-blocks based on the erasure code, the system: transmits, by the controller, an identified sub-block to an ECC-decoder module of the first storage device or to the second storage device for the updated ECC-decoding; performs, by the ECC-decoder module or the second storage device, the updated ECC-decoding on the identified sub-block; and receives, by the controller, the updated ECC-decoded sub-block from the ECC-decoder module or the second storage device.

In some embodiments, in response to unsuccessfully decoding the merged sub-blocks based on the erasure code, the system: decodes, by the ECC-decoder module or the second storage device, an identified sub-block based on the error correction code to obtain an updated ECC-decoded sub-block; and in response to determining, by the ECC decoder module or the second storage device, that a predetermined threshold for error correction has been reached, transmits, by the ECC decoder module or the second storage device to an EC decoder module of the controller, the updated ECC-decoded sub-block.

In some embodiments, the system decodes the merged ECC-decoded sub-blocks based on the erasure code to obtain successful EC-decoding results. In response to performing a cyclic redundancy check on the successful EC-decoding results, the system processes the successful EC-decoding results.

In some embodiments, processing the successful EC-decoding results further comprises: decrypting the successful EC-decoding results; decompressing the decrypted EC-decoding results to obtain final data; and transmitting the final data to a requesting client.

In some embodiments, prior to decoding the encoded local sub-block, the system: retrieves, by the controller, the encoded local sub-block from the first storage device; and adjusts, by a de-scrambler module of the controller, a format of the retrieved sub-block.

In some embodiments, the ECC-decoding is performed by an ECC decoder module of the controller, merging the EC-decoded local sub-block and the remaining sub-block is performed by a merger module of the controller, and the EC-decoding is performed by an EC decoder module of the controller.

In another embodiment, the system receives, by a controller of a first storage device, data to be encoded and stored. The system encodes, by the controller, the data based on an erasure code (EC) to obtain an EC-encoded codeword. The system splits, by the controller, the EC-encoded codeword into sub-blocks. The system transmits, to a second storage device, a sub-block.

BRIEF DESCRIPTION OF THE FIGURES

In the figures, like reference numerals refer to the same figure elements.

DETAILED DESCRIPTION

Figure 1A:
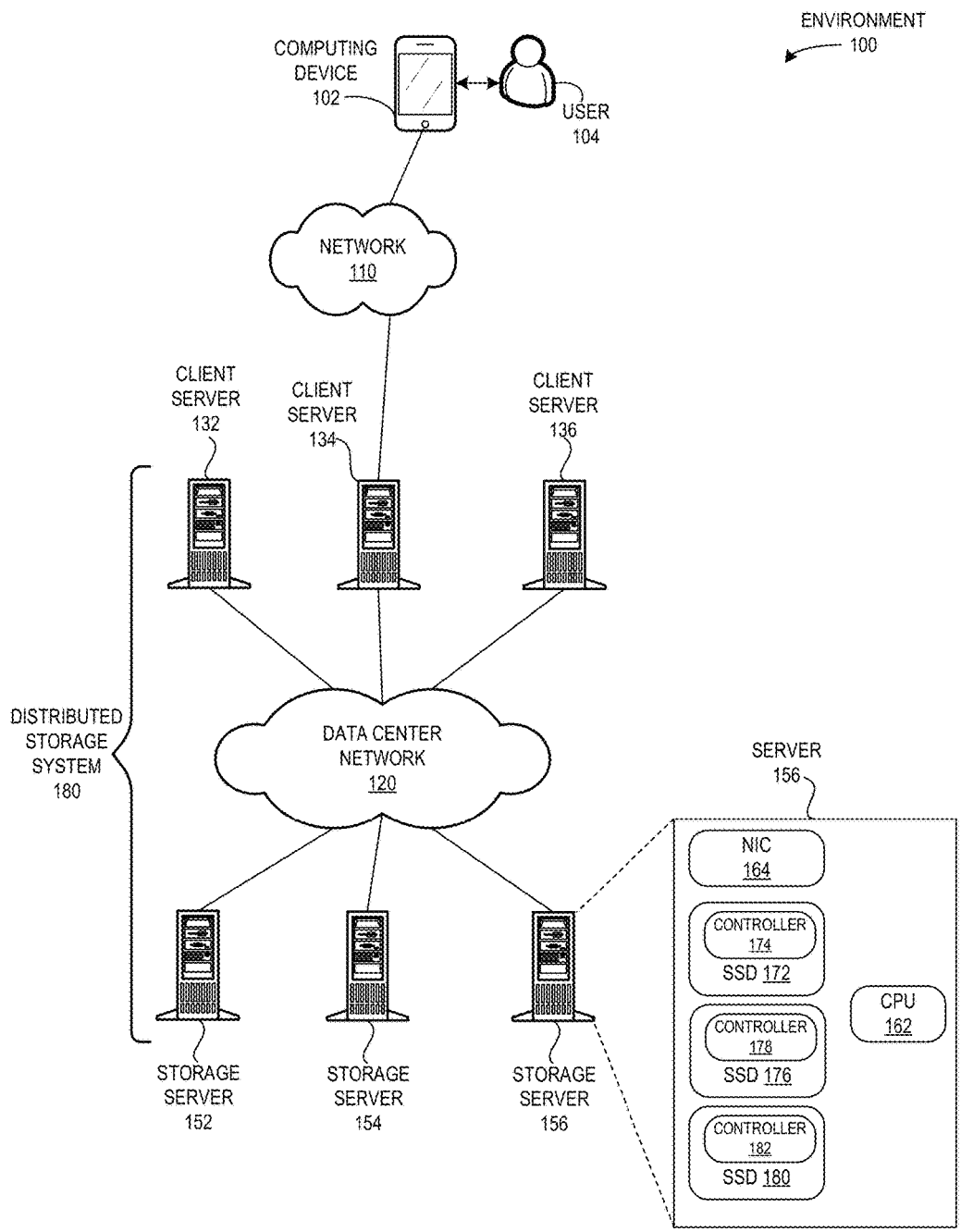
FIG. 1A illustrates an exemplary environment that facilitates iterative data recovery and error correction in a distributed system, in accordance with an embodiment of the present application.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein solve the problem of increasing the efficiency in a distributed storage system by allowing a controller of a single drive to perform both error correction code encoding/decoding and erasure code encoding/decoding. In a typical distributed storage system, the controller (e.g., a storage-controlling module) of a single drive in a computing device performs error correction code (ECC) encoding/decoding, and may require a strict (i.e., low) error correction rate. The ECC encoding/decoding can consume a considerable amount of resources, which can lead to a higher latency. At the same time, the CPU of the computing device typically performs erasure code (EC) encoding/decoding, which can also be computationally expensive and lead to a higher latency. However, EC decoding is typically only used for data recovery, i.e., when the original data cannot be recovered via the powerful ECC decoding. The computationally complex nature of ECC decoding (along with a low error correction rate requirement) may result in a long latency for a single drive's controller to determine an ECC decoding failure. The CPU cannot employ its EC decoder until after it receives a notification of the ECC decoding failure from the single drive (e.g., a failure to find the correct codeword). This latency may decrease the efficiency of a distributed storage system.

The embodiments described herein address this inefficiency by providing a system which places both the ECC encoding/decoding and the EC encoding/decoding in a single controller of a drive (e.g., an SSD) of a computing device. The system further provides an iterative data recovery and error correction process in a distributed storage system by placing a splitter module and a merger module in the same single controller.

During operation, a client (or a client-serving machine of a distributed storage system) may send data to be encoded and stored on a storage server of the distributed storage system. A drive on a storage server ("primary drive") may receive the data to be encoded and stored. The primary drive can encode the data with an erasure code ("EC-encoding"), split the EC-encoded data into sub-blocks, encode a local sub-block with an error correction code ("ECC-encoding"), and store the ECC-encoded local sub-block on a local storage associated with the primary drive. The primary drive can also transmit the remaining sub-blocks to other drives (on the storage server), where a respective other drive performs ECC-encoding on a respective sub-block, and stores the ECC-encoded sub-block on a storage associated with the other drive. A write operation is described below in relation to FIGS. 3A and 3B.

Subsequently, the client (or client-serving machine) may send a request to read the encoded and stored data. The primary drive can receive the request and determine which sub-blocks are to be retrieved from storage. The primary drive can decode the locally stored ECC-encoded sub-block based on the error correction code ("ECC-decoding"). The primary drive can send a message to the other drives to obtain the remainder of the sub-blocks, where an obtained sub-block has been ECC-decoded by one of the other drives. The primary drive can then merge the local ECC-decoded sub-block with the obtained ECC-decoded sub-blocks, and perform erasure code decoding ("EC-decoding) on the merged sub-blocks. The primary drive can determine whether the EC-decoding results are successful. If not, the primary drive can notify the other drives to perform additional ECC-decoding until a certain threshold is met. The other drives which perform this additional ECC-decoding can send the ECC-decoded sub-blocks to the primary drive in a recursive manner, until the primary drive determines that the ECC-decoding results are successful. A read operation is detailed below in relation to FIGS. 4A, 4B, and 5.

Because of the recursive nature of the error correction code and the iterative data recovery via the erasure code decoder, the system may use a less strict requirement for the initial ECC-decoding by each individual drive's controller. For example, the system may only require a higher error correction rate such as $10^{-3}$ (instead of the lower $10^{-7}$). The higher error correction rate can decrease the amount of time necessary for the data to reach convergence, which in turn can lead to an improvement in the overall latency of the system.

Thus, the embodiments described herein provide a system which increases the efficiency of a distributed storage system. The increased efficiency can include an improved performance in latency for completion of I/O tasks, as well as an increased assurance for QoS. By placing the EC-encoding/decoding module and the ECC-encoding/decoding module in a single controller of a drive of a storage server, the system can provide an iterative data recovery and error correction processing. This can result in a lower latency and higher QoS.

The term "distributed storage system" refers to a set of client servers interacting through a set of storage servers via a network, such as a data center network.

A "client" or a user associated with a client refers to an entity which communicates with a distributed storage system via a network, such as the Ethernet.

The term "client server" refers to a client-serving machine, which is part of a distributed storage system.

The term "storage cluster" refers to a group of storage servers.

The term "storage server" refers to a server in a distributed storage system. A storage server can have multiple drives, where data may be written on to a drive for persistent storage. A drive which receives data directly from a client server (or a client-serving machine) may be referred to as a "primary drive." A drive can also include a storage, storage medium, or other storage means associated with the drive.

The terms "storage-controlling module," "storage controller," and "controller" refer to a module or component located within a drive, and may be used interchangeably. In this disclosure, the storage controller includes both an EC-encoder/decoder and an ECC-encoder/decoder. The storage controller also has an associated storage, storage medium, or other storage means.

The term "ECC-encoding" refers to encoding data based on an error correction code, while the term "ECC-decoding" refers to decoding data based on the error correction code. The term "EC-encoding" refers to encoding data based on an erasure code, while the term "EC-decoding" refers to decoding data based on the erasure code.

An "EC-encoder/decoder" is a module which performs EC-encoding/decoding. An "ECC-encoder/decoder" is a module which performs ECC-encoding/decoding.

A "splitter" is a module which divides data into multiple sub-blocks. A "merger" is a module which combines multiple sub-blocks into a single block of data, including by concatenating and re-ordering sub-blocks.

The term "EC group" refers to a group of storage servers which process and store EC-encoded sub-blocks of a single block of data, wherein processing an EC-encoded sub-block may include operations performed by an ECC-encoder/decoder module.

Exemplary System

FIG. 1A illustrates an exemplary environment 100 that facilitates iterative data recovery and error correction in a distributed system, in accordance with an embodiment of the present application. Environment 100 can include a computing device 102 which is associated with a user 104. Computing device 102 can include, for example, a tablet, a mobile phone, an electronic reader, a laptop computer, a desktop computer, or any other computing device. Computing device 102 can communicate via a network 110 with a distributed storage system 180, which can include: client servers (or client-serving machines) 132, 134, and 136; and storage servers 152, 154, and 156. Client servers 132-136 and storage servers 152-156 can communicate with each other via, e.g., a data center network 120. A storage server can include multiples drives. For example, storage server 156 can include components such as a CPU 162, a network interface card (NIC) 164, and solid state drives (SSDs) 172, 176, and 180. A drive can include a controller or a storage-controlling module, as detailed below in relation to FIG. 2A.

For example, in server 156: SSD 172 can include a controller 174; SSD 176 can include a controller 178; and SSD 180 can include a controller 182.

User 104, via computing device 102, can interact with distributed storage system 180 by sending an I/O request. For example, user 102 may wish to perform a task which involves writing data to or reading data from distributed storage system 180. An exemplary communication for a write request is described below in relation to FIGS. 2A, 3A, and 3B, and an exemplary communication for a read request is described below in relation to FIGS. 2A, 4A, and 4B.

Figure 1B:
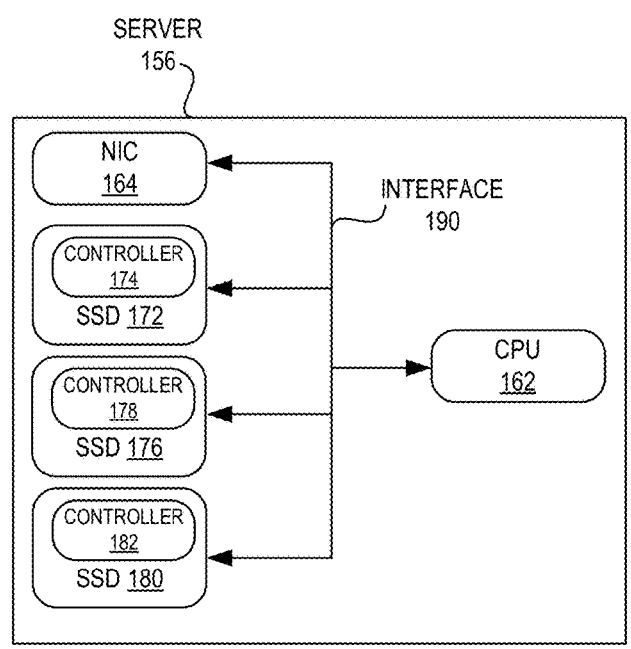
FIG. 1B illustrates an exemplary server that facilitates iterative data recovery and error correction in a distributed system, in accordance with an embodiment of the present application.

FIG. 1B illustrates an exemplary server 156 that facilitates iterative data recovery and error correction in a distributed system, in accordance with an embodiment of the present application. In addition to the components or modules described above in relation to FIG. 1A, server 156 can include an interface 190, via which CPU 162 can communicate with NIC 164 and SSDs 172, 176, and 180. Interface 190 can be a Peripheral Component Interconnect Express (PCIe) interface. In a typical storage server, CPU 162 can include the erasure code (EC) encoding and decoding functionality, while SSDs 172-180 can include the error code correction (ECC) encoding and decoding functionality. In contrast, in the embodiments described herein, both the EC-encoding/decoding and the ECC-encoding/decoding functionality are included in a single controller on a drive, e.g., controller 178 of SSD 176, as described below in relation to FIG. 2A.

Exemplary Controller

Figure 2A:
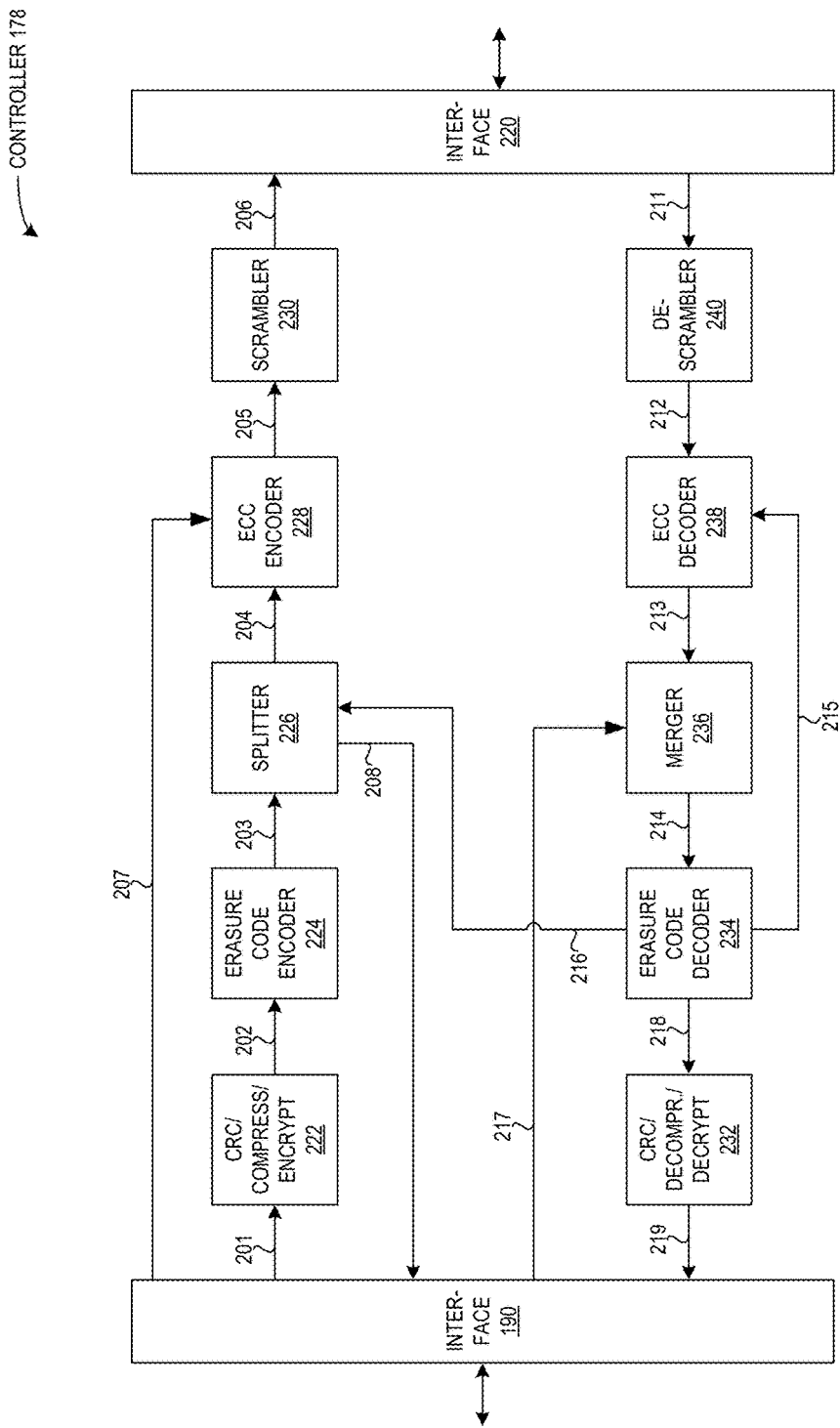
FIG. 2A illustrates an exemplary controller in a server that facilitates iterative data recovery and error correction in a distributed system, in accordance with an embodiment of the present application.

FIG. 2A illustrates exemplary controller 178 in drive 176 of server 156 that facilitates iterative data recovery and error correction in a distributed system, in accordance with an embodiment of the present application. Controller 178 can include interface 190, via which controller 178 may transmit and receive data packets, including read/write requests, data, and sub-blocks of data. Controller 178 can also include an interface 220, via which data may be written to drive 176 (e.g., to NAND memory).

Controller 178 can receive, via interface 190, a request to write data. If the data is received from a client-serving machine (i.e., drive 176 is a primary drive for a set of drives in server 156), the data may be received in a communication 201 by a CRC/Compress/Encrypt (CCE) module 222, which processes the incoming data by performing a cyclic redundancy check (CRC), compressing the data, and encrypting the compressed data. CCE module 222 can send the data in a communication 202 to an erasure code (EC) encoder module 224, which encodes the data based on an erasure code to obtain an EC-encoded codeword. EC encoder module 224 can send the EC-encoded codeword or data in a communication 203 to a splitter module 226, which splits the EC-encoded codeword into N sub-blocks. Splitter 226 may determine a local sub-block (of the N sub-blocks) to be stored locally, and a remainder (of the N sub-blocks) to be stored on other drives. Splitter 226 can send the local sub-block via a communication 204 to an error correction code (ECC) encoder module 228, which encodes the local sub-block based on the error correction code. ECC encoder module 228 can send the data in a communication 205 to a scrambler module 230, which adjusts a format of the ECC-encoded local sub-block and sends the adjusted data in a communication 206 to be written to storage (e.g., via a NAND flash channel to a NAND flash page) via interface 220. Splitter 226 can also send the remaining sub-blocks to the other drives in a communication 208.

If the data is not received from a client-serving machine (i.e., drive 176 is not a primary drive for the set of drives in server 156, or the data is received from another primary drive's splitter module similar to communication 208 described above), controller 178 may send the data in a communication 207 directly to ECC encoder module 228 for ECC encoding. ECC encoder module 228 can send the ECC-encoded data in a communication 205 to scrambler 230 for adjusting, which can send the adjusted data in a communication 206 to be written to storage via interface 220.

Controller 178 can also receive a request to read data which has been written to sub-blocks in multiple locations. If server 176 is the primary drive, controller 178 (or another module) can parse the locations of the corresponding EC sub-blocks and send read requests to the associated storage servers. De-scrambler module 240 can retrieve a local sub-block in a communication 211. De-scrambler module 240 can adjust the format of retrieved local sub-block and send the adjusted sub-block in a communication 212 to an ECC decoder module 238, which can decode the sub-block based on an error correction code (ECC). ECC decoder module 238 can then send the ECC-decoded local sub-block in a communication 213 to a merger module 236. Merger module 236 can merge this ECC-decoded local sub-block with the remaining ECC-decoded sub-blocks received from the other drives (via a communication 217).

Note that because of the iterative nature of the ECC decoder and the EC decoder, the other drives need only perform a minimal amount of decoding. Merger module 236 can transmit the merged ECC-decoded sub-blocks in a communication 214 to an erasure code (EC) decoder module 234, which decodes the merged ECC-decoded sub-blocks based on an erasure code to obtain EC-decoding results. At this point, one of three possibilities may occur. One possibility is that the EC-decoding results are successful, in which case EC decoder module 234 sends the EC-decoding results in a communication 218 to CRC/Decompression/Decrypting (CDD) module 232, which performs a cyclic redundancy check (CRC), decrypts the data, and decompresses the decrypted data to obtain final data. CDD module 232 can send the final data in a communication 219 to a requesting client via interface 190.

A second possibility is that the EC-decoding results are not successful, and the local ECC-decoded sub-block is identified for further processing, in which case EC decoder module 234 instructs in a communication 215 to ECC decoder module 238 to perform further processing (e.g., additional ECC decoding) on the identified local sub-block. A third possibility is that the EC-decoding results are not successful, and non-local ECC-decoded sub-blocks are identified for further processing (e.g., additional ECC decoding on a sub-block previously stored and ECC-decoded by another drive). In this case, EC decoder module 234 sends the identified non-local sub-blocks in a communication 216 back to splitter module 226, which sends an instruction in a communication 208 to a respective other drive to perform further processing (e.g., ECC decoding) on a respective non-local sub-block. The respective other drive then performs the additional ECC-decoding, until a particular threshold or ECC milestone is reached, and sends the updated ECC-decoded sub-block back to controller 178. Controller 178 can receive and send the updated ECC-decoded sub-block in a communication 217 to merger module 236 for continued processing. Evaluating EC decoding results is described below in relation to FIGS. 5A and 5B.

Thus, by placing the EC encoder/decoder and the ECC encoder/decoder (as well as the splitter and the merger) modules into the same controller component of a single drive, the embodiments described herein allow a single drive to perform only a minimal amount of local ECC decoding, and to utilize the EC decoder to iteratively recover the encoded data. This can improve the efficiency of a distributed system by decreasing the latency and increasing the Quality of Service (QoS).

Exemplary Environments for a Write and a Read Operation

Figure 2B:
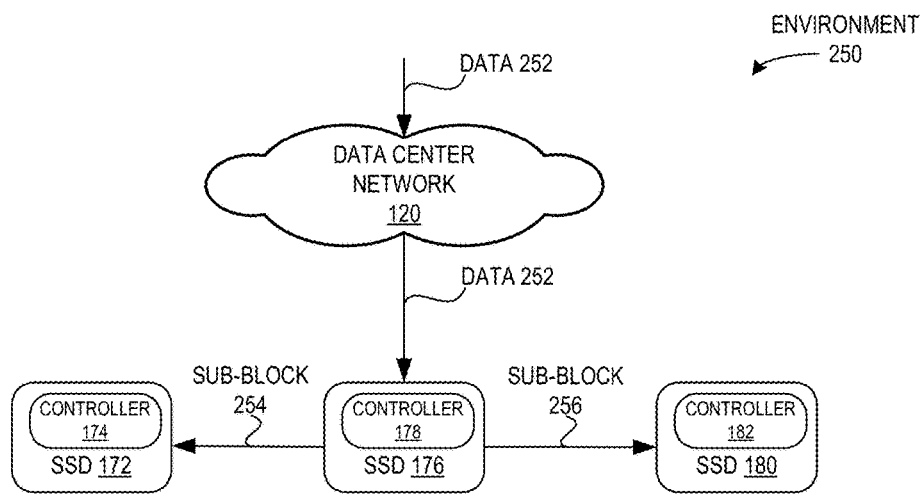
FIG. 2B illustrates an exemplary environment for writing data in a distributed system, in accordance with an embodiment of the present application.

FIG. 2B illustrates an exemplary environment 250 for writing data in a distributed system, in accordance with an embodiment of the present application. Environment 250 can include a data center network 120 and drives 172, 176, and 180 of storage server 156, as in FIG. 1A. Data (to be written) 252 can pass through network 120 and be received by drive 176, which can be a primary drive. Drive 176 can perform the actions described above for a primary drive in FIG. 2A: process the data; EC-encode the data; split the EC-encoded data into sub-blocks; ECC-encode a local sub-block; and store the ECC-encoded local sub-block on drive 176. Drive 176 can also send a remainder of the split EC-encoded sub-blocks 254 and 256 to drives 172 and 180 (i.e., other drives in a same EC group) to be ECC-encoded and stored. Writing the data is performed in a single round, e.g., implemented once per sub-block.

Figure 2C:
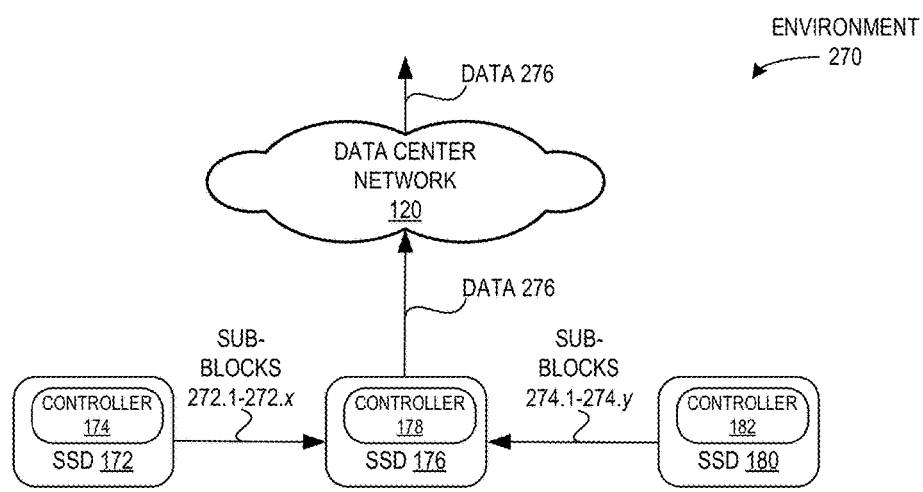
FIG. 2C illustrates an exemplary environment for reading data in a distributed system, in accordance with an embodiment of the present application.

FIG. 2C illustrates an exemplary environment 270 for reading data in a distributed system, in accordance with an embodiment of the present application. Upon receiving a request to read data which has been stored as encoded sub-blocks in multiple storage servers, primary drive 176 can communicate with drives 172 and 180 (i.e., other drives in the same EC group). Based on the EC-decoding results obtained by drive 176 (e.g., the three possibilities as described in relation to FIG. 2A in communications 215, 216, and 218), some drives may recursively work on ECC-decoding, in which case the data may be sent to primary drive 176 multiple times (e.g., as sub-blocks 272.1-272.x from drive 172, and as sub-blocks 274.1-274.y from drive 180). Thus, reading the data may be performed in multiple rounds, e.g., implemented multiple times per sub-block, depending on the EC-decoding results.

Exemplary Communication During a Write Operation

Figure 3A:
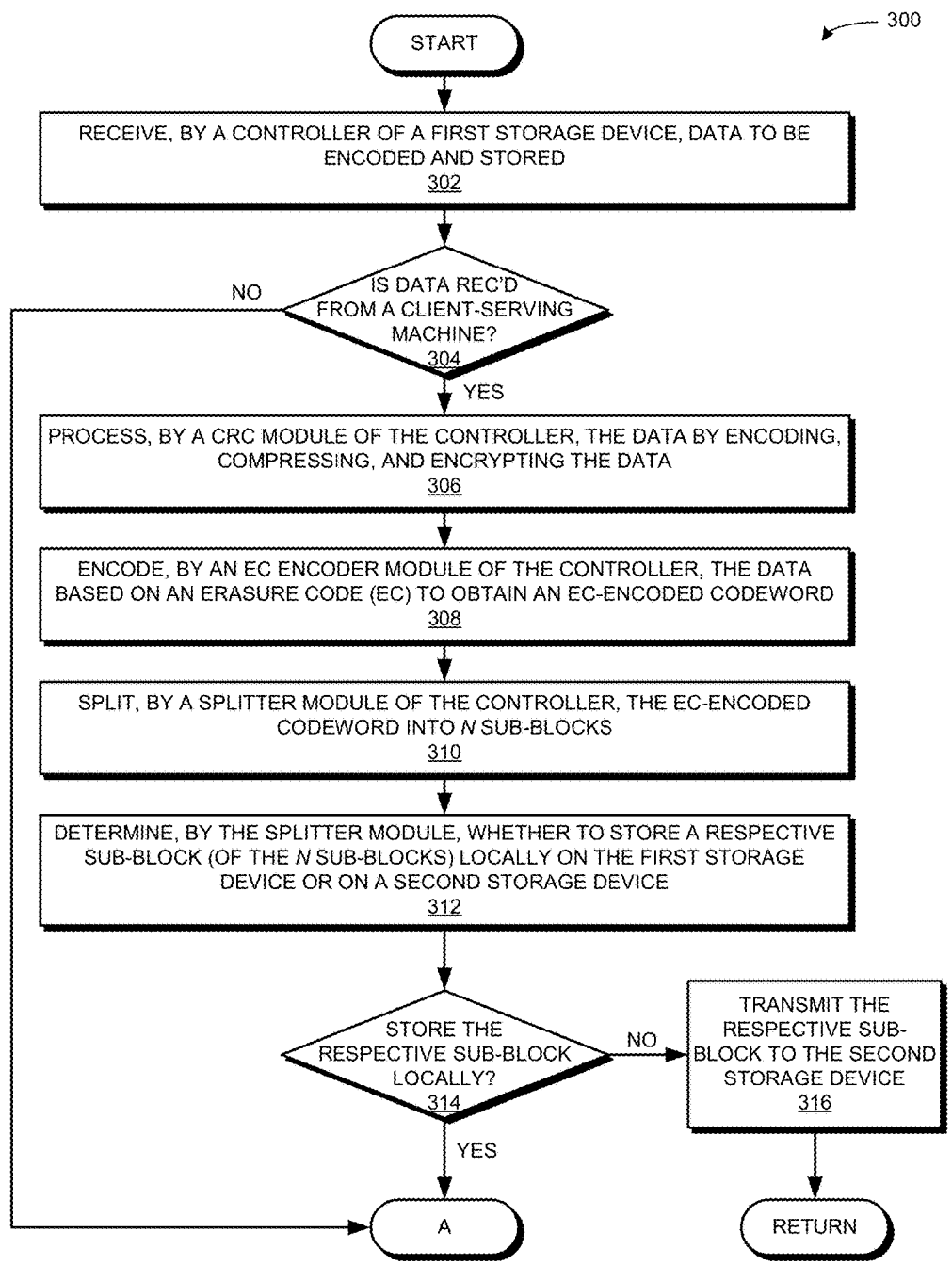
FIG. 3A presents a flowchart illustrating a method for writing data in a distributed system, in accordance with an embodiment of the present application.

FIG. 3A presents a flowchart 300 illustrating a method for writing data in a distributed system, in accordance with an embodiment of the present application. During operation, the system receives, by a controller of a first storage device, data to be encoded and stored (operation 302). If the data is not received from a client-serving machine (decision 304), the operation continues as described at Label A of FIG. 3B. If the data is received from a client-serving machine (decision 304) (which implies that the first storage device is a primary drive for a group of drives), the system processes, by a CRC module of the controller, the data by encoding, compressing, and encrypting the data (operation 306). The system encodes, by an EC encoder module of the controller, the data based on an erasure code (EC) to obtain an EC-encoded codeword (operation 308). The system splits, by a splitter module of the controller, the EC-encoded codeword into N sub-blocks (operation 310). The system determines, by the splitter module, whether to store a respective sub-block (of the N sub-blocks) locally on the first storage device or on a second storage device (operation 312). If the system stores the respective sub-block locally (decision 314), the operation continues as described at Label A of FIG. 3B. If the system does not store the respective sub-block locally (decision 314), the system transmits the respective sub-block to the second storage device (operation 316). The transmitted sub-block is to be ECC-encoded and stored by the second storage device.

Figure 3B:
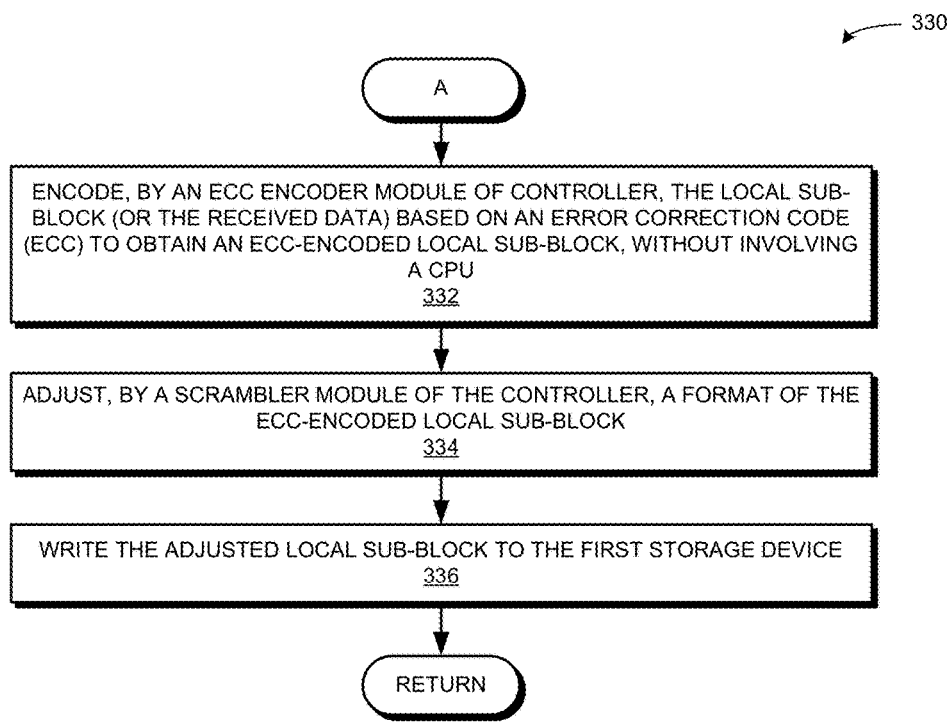
FIG. 3B presents a flowchart illustrating a method for writing data in a distributed system, in accordance with an embodiment of the present application.

FIG. 3B presents a flowchart 330 illustrating a method for writing data in a distributed system, in accordance with an embodiment of the present application. During operation, at Label A, the system encodes, by an ECC encoder module of the controller, the local sub-block (or the received data) based on an error correction code (ECC) to obtain an ECC-encoded local sub-block, without involving a CPU (operation 332). The system adjusts, by a scrambler module of the controller, a format of the ECC-encoded local sub-block (operation 334). The system writes the adjusted local sub-block to the first storage device (operation 336), and the operation returns. For example, the system can transmit the adjusted local sub-block via one or more NAND channels, and write the adjusted local sub-block into one or more NAND flash pages.

Exemplary Communication During a Read Operation

Figure 4A:
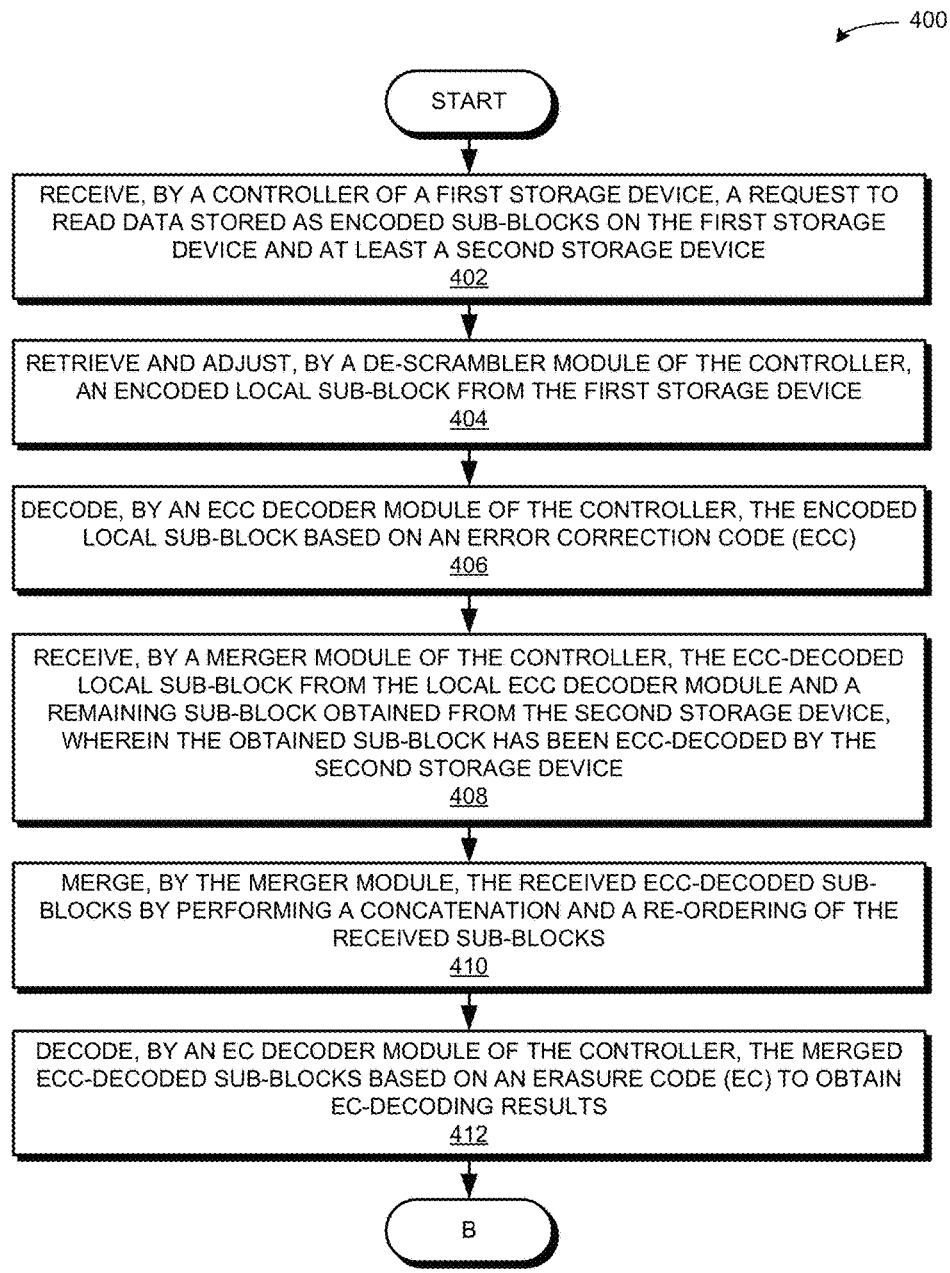
FIG. 4A presents a flowchart illustrating a method for reading data in a distributed system, in accordance with an embodiment of the present application.

FIG. 4A presents a flowchart 400 illustrating a method for reading data in a distributed system, in accordance with an embodiment of the present application. During operation, the system receives, by a controller of a first storage device, a request to read data stored as encoded sub-blocks on the first storage device and at least a second storage device (operation 402). The system retrieves and adjusts, by a de-scrambler module of the controller, an encoded local sub-block from the first storage device (operation 404). The system decodes, by an ECC decoder module of the controller, the encoded local sub-block based on an error correction code (ECC) (operation 406). Recall that the system only needs to perform a minimal amount of ECC decoding in this step. That is, the system may use a higher than normal error correction rate (i.e., setting an "easier" threshold to be reached) because of the iterative nature of the embodiments described herein.

Subsequently, the system receives, by a merger module of the controller, the ECC-decoded local sub-block from the local ECC decoder module and a remaining sub-block obtained from the second storage device, wherein the obtained sub-block has been ECC-decoded by the second storage device (operation 408). The system merges, by the merger module, the received ECC-decoded sub-blocks by performing a concatenation and a re-ordering of the received sub-blocks (operation 410). The system decodes, by an EC decoder module of the controller, the merged ECC-decoded sub-blocks based on an erasure code (EC) to obtain EC-decoding results (operation 412). The operation continues as described at Label A of FIG. 4B.

The read request of operation 402 may be received from a client-serving machine by the controller, which can be a primary drive for a group of drives (e.g., a same EC group). The controller (or another module) of the primary drive can parse the locations of the corresponding EC-encoded sub-blocks and send read requests to the other drives in the same EC group. Alternately, the read request may be received from a machine that is not a client-serving machine (e.g., another storage server), in which case the receiving drive is a non-primary drive. The non-primary drive may perform operations 402, 404, and 406, and then send its ECC-decoded sub-block to the primary drive, where it is received by the primary drive in operation 408 (as in communication 217 of FIG. 2A).

Figure 4B:
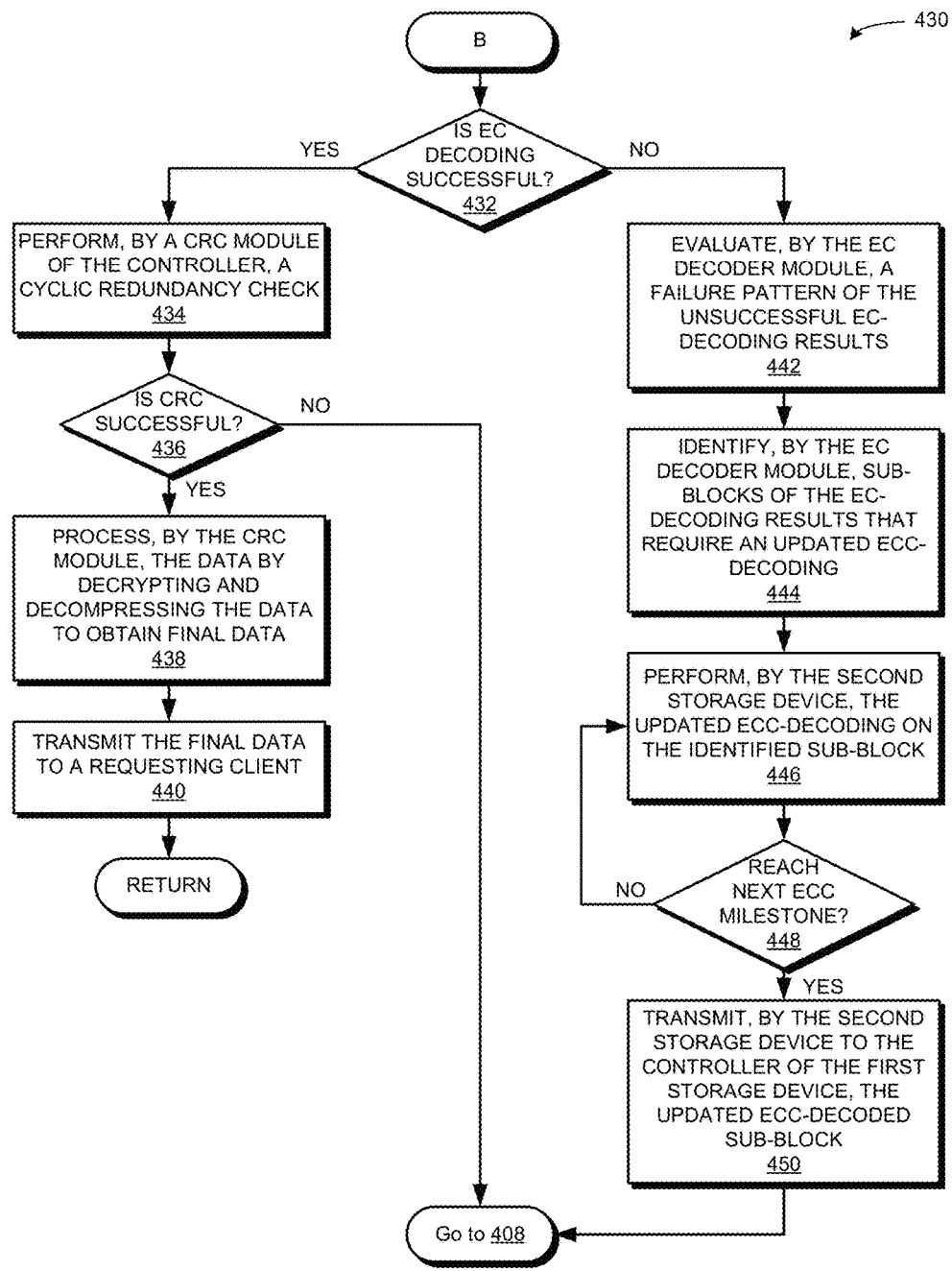
FIG. 4B presents a flowchart illustrating a method for reading data in a distributed system, in accordance with an embodiment of the present application.

FIG. 4B presents a flowchart 430 illustrating a method for reading data in a distributed system, in accordance with an embodiment of the present application. During operation, the system determines whether the EC-decoding results are successful (decision 432). If the EC-decoding results are successful (decision 432), the system performs, by a CRC module of the controller, a cyclic redundancy check (CRC)

(operation 434). If the CRC is not successful (decision 436), the operation continues as at operation 408. If the CRC is successful (decision 436), the system processes, by the CRC module, the data by decrypting and decompressing the data to obtain the final data (operation 438). The system transmits the final data to a requesting client (operation 440), and the operation returns. The requesting client can be a client-serving machine reached via the data center network in the same distributed storage system. The requesting client can also be a user associated with a computing device which interacts with a client-serving machine of the distributed storage system via the Ethernet or other network.

If the EC-decoding results are not successful (decision 432), the system evaluates, by the EC decoder module, a failure pattern of the unsuccessful EC-decoding results (operation 442). The system identifies, by the EC decoder module, sub-blocks of the EC-decoding results that require an updated ECC-decoding (operation 444). The identified sub-blocks can include a local sub-block of the first storage device or a sub-block that was previously encoded and stored by a second storage device. The system performs, by the second storage device, the updated ECC-decoding on the identified sub-block (operation 446). The updated ECC-decoding may also be performed by the first storage device if the identified sub-block is a local sub-block of the first storage device. If the second storage device (or the first storage device in the case of a local sub-block) determines that the next ECC milestone is reached (decision 448) (e.g., that a predetermined threshold for an error correction rate has been reached), the system transmits, by the second storage device (or the first storage device in the case of a local sub-block) to the controller of the first storage device, the updated ECC-decoded sub-block (operation 450). If the next ECC milestone is not reached (decision 448), the system continues to perform the updated ECC-decoding on the identified sub-block (operation 446). The second storage device (or the first storage device in the case of a local sub-block) iterates through the error correction until a pre-determined milestone, rate, or threshold has been reached, and subsequently transmits the updated ECC-decoded sub-block (operation 450), whereupon the operation continues as at operation 408.

Thus, by placing the EC-encoding/decoding module and the ECC-encoding/decoding module in a single controller of a drive, the embodiments described herein provide a system which increases the efficiency of a distributed storage system. The iterative data recovery and error correction processing can provide an increased efficiency which includes an improved performance (e.g., lower latency) for completion of I/O tasks, as well as an increased QoS.

Evaluating EC Decoding Results and Performing Further ECC Decoding

Figure 5A:
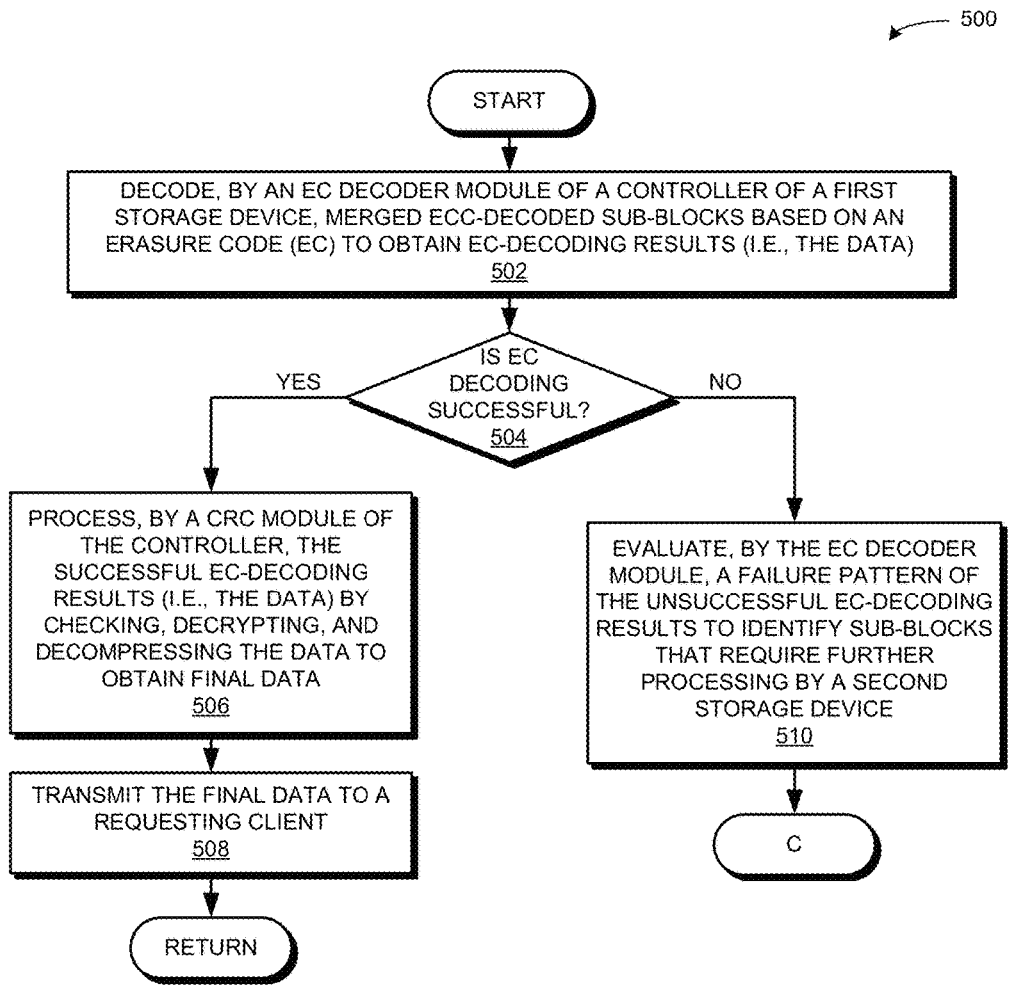
FIG. 5A presents a flowchart illustrating a method for evaluating EC decoding results, in accordance with an embodiment of the present application.

FIG. 5A presents a flowchart 500 illustrating a method for evaluating EC decoding results, in accordance with an embodiment of the present application. During operation, the system decodes, by an EC decoder module of a controller of a first storage device, merged ECC-decoded sub-blocks based on an erasure code (EC) to obtain EC-decoding results (i.e., the data) (operation 502). The system determines whether the EC decoding is successful (decision 504). If it is successful (decision 504), the system processes, by a CRC module of the controller, the successful EC-decoding results (i.e., the data) by checking, decrypting, and decompressing the data to obtain final data (operation 506). The system transmits the final data to a requesting client (operation 508), and the operation returns. If the EC decoding is not successful (decision 504), the system evaluates, by the EC decoder module, a failure pattern of the unsuccessful EC-decoding results to identify sub-blocks that require further processing by a second storage device (operation 510). Recall that the identified sub-blocks can include a local sub-block of the first storage device or a sub-block that was previously encoded and stored by a second storage device. The operation continues as described at Label C of FIG. 5B.

Figure 5B:
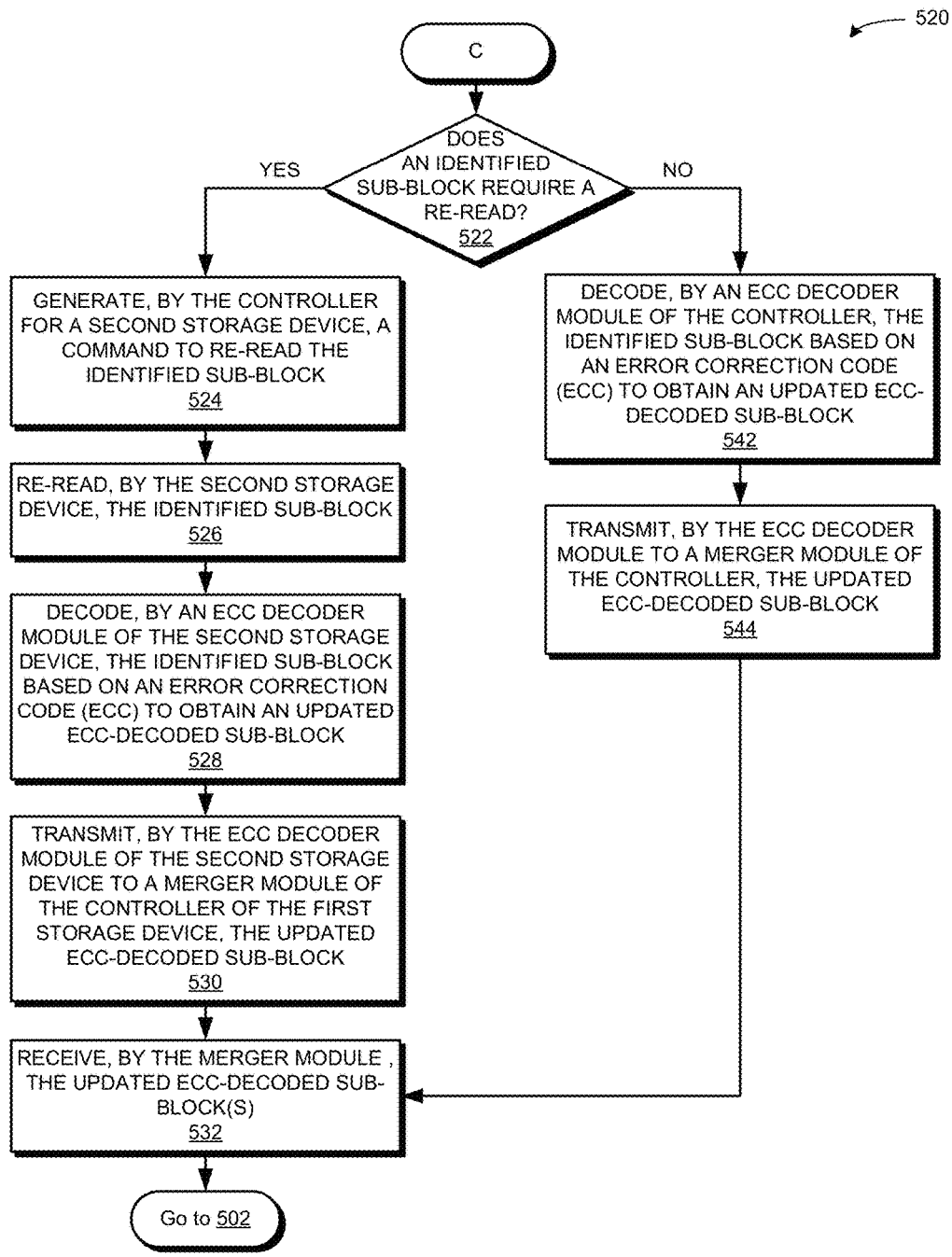
FIG. 5B presents a flowchart illustrating a method for performing further ECC decoding, in accordance with an embodiment of the present application.

FIG. 5B presents a flowchart 520 illustrating a method for performing further ECC decoding, in accordance with an embodiment of the present application. During operation, the system determines whether an identified sub-block requires a re-read (decision 522). If it does, the system generates, by the controller for a second storage device, a command to re-read the identified sub-block (operation 524). The command may also be generated by the controller of the first storage device and sent to the ECC decoder module of the first storage device if the identified sub-block is a local sub-block. The system re-reads, by the second storage device (or by the ECC decoder module of the first storage device), the identified sub-block (operation 526). The system decodes, by an ECC decoder module of the second storage device (or by the ECC decoder module of the first storage device), the identified sub-block based on an error correction code (ECC) to obtain an updated ECC-decoded sub-block (operation 528). The system transmits, by the ECC decoder module of the second storage device (or by the ECC decoder module of the first storage device) to a merger module of the controller of the first storage device, the updated ECC-decoded sub-block (operation 530). The system receives, by the merger module, the updated ECC-decoded sub-block(s) (operation 532), and the operation continues as at operation 502.

If the identified sub-block does not require a re-read (decision 522), the system decodes, by an ECC decoder module of the controller, the identified sub-block based on an error correction code (ECC) to obtain an updated ECC-decoded sub-block (operation 542). The system transmits, by the ECC decoder module to a merger module of the controller, the updated ECC-decoded sub-block (operation 544). The merger module receives the updated ECC-decoded sub-block(s), and the operation continues as at operation 502.

Exemplary Computer System and Apparatus

Figure 6:
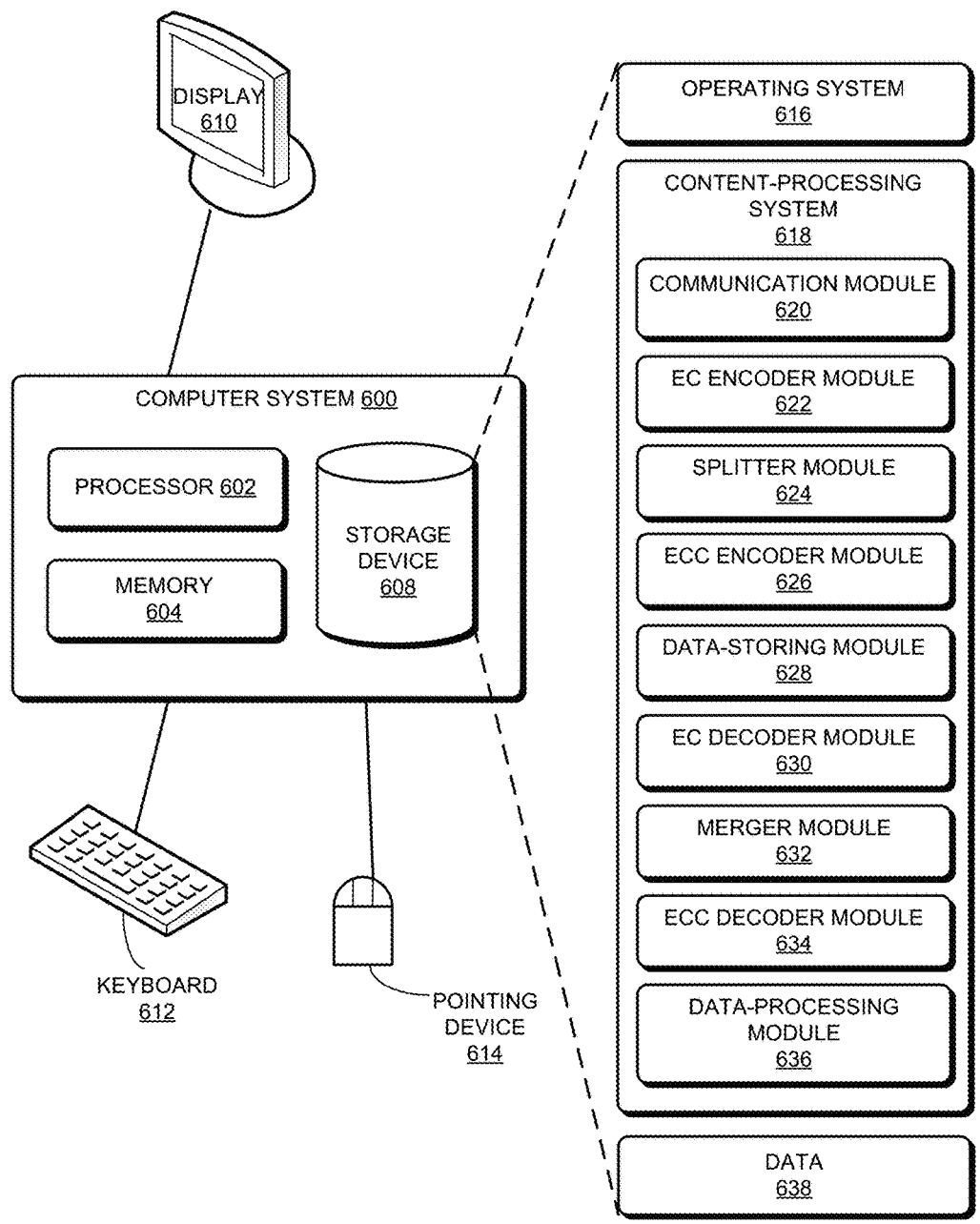
FIG. 6 illustrates an exemplary computer system that facilitates iterative data recovery and error correction in a distributed system, in accordance with an embodiment of the present application.

FIG. 6 illustrates an exemplary computer system that facilitates iterative data recovery and error correction in a distributed system, in accordance with an embodiment of the present application. Computer system 600 includes a processor 602, a memory 604, and a storage device 608. Computer system 600 may be a client-serving machine. Memory 604 can include a volatile memory (e.g., RAM) that serves as a managed memory, and can be used to store one or more memory pools. Furthermore, computer system 600 can be coupled to a display device 610, a keyboard 612, and a pointing device 614. Storage device 608 can store an operating system 616, a content-processing system 618, and data 638.

Content-processing system 618 can include instructions, which when executed by computer system 600, can cause computer system 600 to perform methods and/or processes described in this disclosure. Specifically, content-processing system 618 can include instructions for receiving and transmitting data packets, including a request to write or read data, data to be encoded and stored, a sub-block of data, and an encoded sub-block of data. Content-processing system 618 can further include instructions for receiving, by a controller of a first storage device, data to be encoded and stored (communication module 620). Content-processing system 618 can include instructions for encoding, by the controller, the data based on an erasure code (EC) to obtain an EC-encoded codeword (EC encoder module 622). Content-processing system 618 can also include instructions for splitting, by the controller, the EC-encoded codeword into sub-blocks (splitter module 624). Content-processing system 618 can include instructions for encoding, by the controller, a sub-block based on an error correction code (ECC) to obtain an ECC-encoded local sub-block, without involving a central processing unit (CPU) (ECC encoder module 626). Content-processing system 618 can include instructions for storing the ECC-encoded local sub-block in the first storage device (data-storing module 628). Content-processing system 618 can additionally include instructions for transmitting, to a second storage device, a remaining sub-block, wherein the transmitted sub-block is to be ECC-encoded and stored by the second storage device (communication module 620).

Furthermore, content-processing system 618 can include instructions for receiving, by a controller of a first storage device, a request to read data stored as encoded sub-blocks on the first storage device and at least a second storage device (communication module 620). Content-processing system 618 can include instructions for decoding, by the controller, an encoded local sub-block stored in the first storage device based on an error correction code (ECC) (ECC decoder module 634). Content-processing system 618 can also include instructions for merging, by the controller, the ECC-decoded local sub-block and a remaining sub-block obtained from the second storage device, wherein the obtained sub-block has been ECC-decoded by the second storage device (merger module 632). Content-processing system 618 can include instructions for, in response to unsuccessfully decoding the merged ECC-decoded sub-blocks based on an erasure code (EC) to obtain EC-decoding results (EC decoder module 630): identify sub-blocks of the EC-decoding results that require an updated ECC-decoding (EC decoder module 630); re-merge the updated ECC-decoded sub-blocks into the EC-decoding results (merger module 632); and decode the re-merged ECC-decoded sub-blocks based on the erasure code (EC decoder module 630), thereby allowing the first storage device to decode the data without involving a central processing unit (CPU).

Additionally, content-processing system 618 can include instructions for processing data by encoding/decoding the data based on a CRC, compressing/decompressing the data, and encrypting/decrypting the data (data-processing module 636). Content-processing system 618 can include instructions for adjusting a format of data (data-processing module 636).

Data 638 can include any data that is required as input or that is generated as output by the methods and/or processes described in this disclosure. Specifically, data 638 can store at least: data to be written, read, stored, or accessed; processed or stored data; encoded or decoded data; encrypted or compressed data; decrypted or decompressed data; a sub-block of data; an erasure code (EC) encoding or decoding; an error correction code (ECC) encoding or decoding; an indication of whether data is received from a client-serving machine; an identifier of a NAND channel or a NAND flash page; an adjusted format of data; adjusted data associated with a scrambler or a de-scrambler; a predetermined milestone, rate, limit, or threshold; an error correction rate; and a cyclic redundancy check.

Figure 7:
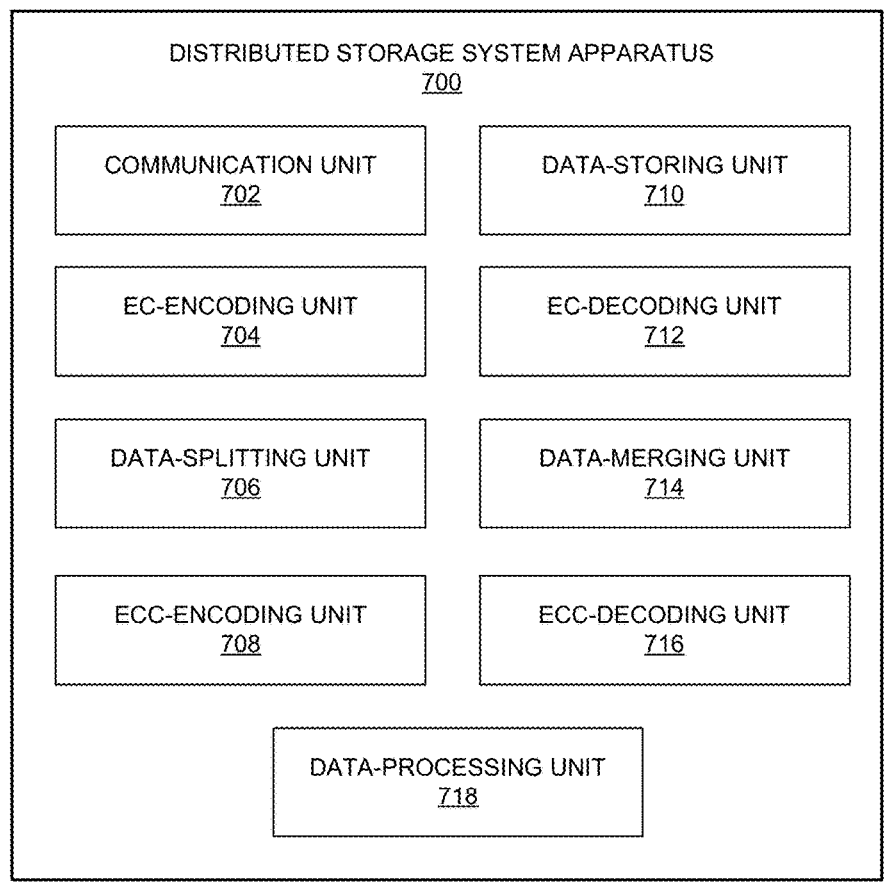
FIG. 7 illustrates an exemplary apparatus that facilitates iterative data recovery and error correction in a distributed system, in accordance with an embodiment of the present application.

FIG. 7 illustrates an exemplary apparatus that facilitates iterative data recovery and error correction in a distributed system, in accordance with an embodiment of the present application. Apparatus 700 can comprise a plurality of units or apparatuses which may communicate with one another via a wired, wireless, quantum light, or electrical communication channel. Apparatus 700 may be realized using one or more integrated circuits, and may include fewer or more units or apparatuses than those shown in FIG. 7. Further, apparatus 700 may be integrated in a computer system, or realized as a separate device which is capable of communicating with other computer systems and/or devices. Specifically, apparatus 700 can comprise units 702-718 which perform functions or operations similar to modules 620-636 of computer system 600 of FIG. 68, including: a communication unit 702; an EC-encoding unit 704; a data-splitting unit 706; an ECC-encoding unit 708; a data-storing unit 710; an EC-decoding unit 712; a data-merging unit 714; an ECC-decoding unit 716; and a data-processing unit 718.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method for facilitating iterative data recovery and error correction in a distributed system, the method comprising:

receiving, by a controller of a first storage device, data to be encoded and stored;

encoding, by the controller, the data based on an erasure code (EC) to obtain an EC-encoded codeword;

splitting, by the controller, the EC-encoded codeword into sub-blocks;

encoding, by the controller, a sub-block based on an error correction code (ECC) to obtain an ECC-encoded local sub-block;

storing the ECC-encoded local sub-block in the first storage device;

transmitting, to a second storage device, a remaining sub-block, wherein the transmitted sub-block is to be ECC-encoded and stored by the second storage device, thereby allowing the data to be subsequently decoded by the first storage device;

receiving, by the controller of the first storage device, a request to read data stored as encoded sub-blocks on the first storage device and at least the second storage device;

decoding, by an ECC decoder module of the controller of the first storage device, an encoded local sub-block stored in the first storage device based on the error correction code (ECC);

merging, by the controller, the ECC-decoded local sub-block and a remaining sub-block obtained from the second storage device, wherein the obtained remaining sub-block has been ECC-decoded by the second storage device; and in response to unsuccessfully decoding the merged ECC-decoded sub-blocks based on the erasure code (EC) to obtain EC-decoding results:

identifying sub-blocks of the EC-decoding results that require an updated ECC-decoding;

performing, by the ECC decoder module of the first storage device or by an ECC decoder module of the second storage device, the updated ECC-decoding on the identified sub-block; and in response to determining, by the ECC decoder module of the first storage device or by the ECC decoder module of the second storage device, that a predetermined threshold for error correction has been reached, transmitting, by the ECC decoder module of the first storage device or by the ECC decoder module of the second storage device to an EC decoder module of the first storage device, the updated ECC-decoded sub-block.

2. The method of claim 1, wherein subsequent to receiving the data, the method is performed in response to determining that the data is received from a client-serving machine, and wherein the method further comprises:

in response to determining that the data is received from a machine that is not a client-serving machine:

encoding, by the controller, the received data based on the error correction code; and storing the ECC-encoded data in the first storage device.

3. The method of claim 1, wherein prior to encoding the data based on the erasure code, the method further comprises:

processing the data by:

encoding the data based on a cyclic redundancy check;

compressing the encoded data; and encrypting the compressed data.

4. The method of claim 1, wherein storing the ECC-encoded local sub-block in the first storage device further comprises:

adjusting, by a scrambler module of the controller, a format of the ECC-encoded local sub-block; and writing the adjusted local sub-block to the first storage device.

5. The method of claim 4, wherein writing the adjusted local sub-block to the first storage device further comprises:

transmitting the adjusted local sub-block to one or more NAND channels; and writing the adjusted local sub-block into one or more NAND flash pages.

6. The method of claim 1, further comprising:

in advance of encoding the sub-block based on the error correction code, identifying the sub-block for processing and storing by the first storage device.

7. The method of claim 1, wherein the EC-encoding is performed by an EC encoder module of the controller, wherein splitting the EC-encoded codeword is performed by a splitter module of the controller, and wherein the ECC-encoding is performed by an ECC encoder module of the controller.

8. A computer-implemented method for facilitating iterative data recovery and error correction in a distributed system, the method comprising:

receiving, by a controller of a first storage device, a request to read data stored as encoded sub-blocks on the first storage device and at least a second storage device;

decoding, by the controller, an encoded local sub-block stored in the first storage device based on an error correction code (ECC);

merging, by the controller, the ECC-decoded local sub-block and a remaining sub-block obtained from the second storage device, wherein the obtained sub-block has been ECC-decoded by the second storage device; and in response to unsuccessfully decoding the merged ECC-decoded sub-blocks based on an erasure code (EC) to obtain EC-decoding results:

identifying sub-blocks of the EC-decoding results that require an updated ECC-decoding;

re-merging the updated ECC-decoded sub-blocks into the EC-decoding results; and decoding the re-merged ECC-decoded sub-blocks based on the erasure code, thereby allowing the first storage device to decode the data without involving a central processing unit (CPU).

9. The method of claim 8, wherein in response to unsuccessfully decoding the merged ECC-decoded sub-blocks based on the erasure code, the method further comprises:

transmitting, by the controller, an identified sub-block to an ECC-decoder module of the first storage device or to the second storage device for the updated ECC-decoding;

performing, by the ECC-decoder module or the second storage device, the updated ECC-decoding on the identified sub-block; and receiving, by the controller, the updated ECC-decoded sub-block from the ECC-decoder module or the second storage device.

10. The method of claim 8, wherein in response to unsuccessfully decoding the merged sub-blocks based on the erasure code, the method further comprises:

decoding, by the ECC-decoder module or the second storage device, an identified sub-block based on the error correction code to obtain an updated ECC-decoded sub-block; and in response to determining, by the ECC decoder module or the second storage device, that a predetermined threshold for error correction has been reached, transmitting, by the ECC decoder module or the second storage device to an EC decoder module of the controller, the updated ECC-decoded sub-block.

11. The method of claim 8, further comprising:

decoding the merged ECC-decoded sub-blocks based on the erasure code to obtain successful EC-decoding results; and in response to performing a cyclic redundancy check on the successful EC-decoding results, processing the successful EC-decoding results.

12. The method of claim 11, wherein processing the successful EC-decoding results further comprises:
    decrypting the successful EC-decoding results;
    decompressing the decrypted EC-decoding results to obtain final data; and
    transmitting the final data to a requesting client.

13. The method of claim 8, wherein prior to decoding the encoded local sub-block, the method further comprises:
    retrieving, by the controller, the encoded local sub-block from the first storage device; and
    adjusting, by a de-scrambler module of the controller, a format of the retrieved sub-block.

14. The method of claim 8, wherein the ECC-decoding is performed by an ECC decoder module of the controller,
    wherein merging the EC-decoded local sub-block and the remaining sub-block is performed by a merger module of the controller, and
    wherein the EC-decoding is performed by an EC decoder module of the controller.

15. A computer system for facilitating iterative data recovery and error correction in a distributed system, the system comprising:
    a processor; and
    a memory coupled to the processor and storing instructions, which when executed by the processor cause the processor to perform a method, the method comprising:
    receiving, by a controller of the system which is a first storage device, a request to read data stored as encoded sub-blocks on the first storage device and at least a second storage device;
    decoding, by the controller, an encoded local sub-block stored in the first storage device based on an error correction code (ECC);
    merging, by the controller, the ECC-decoded local sub-block and a remaining sub-block obtained from the second storage device, wherein the obtained sub-block has been ECC-decoded by the second storage device; and
    in response to unsuccessfully decoding the merged ECC-decoded sub-blocks based on an erasure code (EC) to obtain EC-decoding results:
        identifying sub-blocks of the EC-decoding results that require an updated ECC-decoding;
        re-merging the updated ECC-decoded sub-blocks into the EC-decoding results; and
        decoding the re-merged ECC-decoded sub-blocks based on the erasure code,
    thereby allowing the system to decode the data without involving a central processing unit (CPU).

16. The computer system of claim 15, wherein in response to unsuccessfully decoding the merged ECC-decoded sub-blocks based on the erasure code, the method further comprises:
    transmitting, by the controller, an identified sub-block to an ECC-decoder module of the first storage device or to the second storage device for the updated ECC-decoding;
    performing, by the ECC-decoder module or the second storage device, the updated ECC-decoding on the identified sub-block; and
    receiving, by the controller, the updated ECC-decoded sub-block from the ECC-decoder module or the second storage device.

17. The computer system of claim 15, wherein in response to unsuccessfully decoding the merged sub-blocks based on the erasure code, the method further comprises:
    decoding, by the ECC-decoder module or the second storage device, an identified sub-block based on the error correction code to obtain an updated ECC-decoded sub-block; and
    in response to determining, by the ECC decoder module or the second storage device, that a predetermined threshold for error correction has been reached, transmitting, by the ECC decoder module or the second storage device to an EC decoder module of the controller, the updated ECC-decoded sub-block.

18. The computer system of claim 15, wherein the method further comprises:
    decoding the merged ECC-decoded sub-blocks based on the erasure code to obtain successful EC-decoding results; and
    in response to performing a cyclic redundancy check on the successful EC-decoding results, processing the successful EC-decoding results by:
        decrypting the successful EC-decoding results;
        decompressing the decrypted EC-decoding results to obtain final data; and
        transmitting the final data to a requesting client.

19. The computer system of claim 15, wherein prior to decoding the encoded local sub-block, the method further comprises:
    retrieving, by the controller, the encoded local sub-block from the first storage device; and
    adjusting, by a de-scrambler module of the controller, a format of the retrieved sub-block.

20. The computer system of claim 15, wherein the ECC-decoding is performed by an EC decoder module of the controller,
    wherein merging the EC-decoded local sub-block and the remaining sub-block is performed by a merger module of the controller, and
    wherein the EC-decoding is performed by an EC decoder module of the controller.

21. A computer-implemented method, comprising:
    receiving, by a controller of a first storage device, data to be encoded and stored;
    encoding, by the controller, the data based on an erasure code (EC) to obtain an EC-encoded codeword;
    splitting, by the controller, the EC-encoded codeword into sub-blocks; and
    transmitting, to a second storage device, a first sub-block of the EC-encoded codeword, wherein the transmitted sub-block is to be encoded based on an error-correction code (ECC) to obtain an ECC-encoded sub-block and further stored by the second storage device;
    receiving, by the controller of the first storage device, a request to read data stored as encoded sub-blocks on the first storage device and at least the second storage device;
    obtaining, by the controller from the second storage device, the first sub-block which was stored and ECC-encoded by the second storage device, and subsequently ECC-decoded by the second storage device, to obtain a first ECC-decoded sub-block;
    merging, by the controller, at least an ECC-decoded local sub-block from the first storage device and the first ECC-decoded sub-block from the second storage device; and in response to unsuccessfully decoding the merged ECC-decoded sub-blocks based on the erasure code (EC) to obtain EC-decoding results:
  identifying sub-blocks of the EC-decoding results that require an updated ECC-decoding;
  performing, by an ECC decoder module of the first storage device or by the second storage device, the updated ECC-decoding on the identified sub-block; and
  in response to determining, by the ECC decoder module or by the second storage device, that a predetermined threshold for error correction has been reached, transmitting, by the ECC decoder module or the second storage device to an EC decoder module of the first storage device, the updated ECC-decoded sub-block decoding.

* * * * *